May 21, 1963 — A. K. TATEISHI — 3,090,919

AUDIO-AMPLIFIER-RADIO TUNER COMBINATION
AND LOW DRAIN TUNER THEREFOR

Filed July 27, 1959 — 4 Sheets-Sheet 1

Inventor
ARTHUR K. TATEISHI by: Douglas S. Johnson

Attorney

Inventor
ARTHUR K. TATEISHI
by: Douglas S. Johnson
Attorney

Inventor
ARTHUR K. TATEISHI
by: Douglas S. Johnson
Attorney

INVENTOR
ARTHUR K. TATEISHI

BY

ATTORNEY

United States Patent Office
3,090,919
Patented May 21, 1963

3,090,919

AUDIO-AMPLIFIER-RADIO TUNER COMBINATION AND LOW DRAIN TUNER THEREFOR

Arthur K. Tateishi, 32 River St., Toronto, Ontario, Canada

Filed July 27, 1959, Ser. No. 829,719
24 Claims. (Cl. 325—356)

This invention is directed to enabling audio amplifiers of even the simplest kind having no reserve of power to be manufactured without circuitry redesign and with negligible increase in cost of manufacture to be easily and quickly combined as and when desired with a radio tuner so that the radio tuner is powered from the amplifier and the amplifier forms the audio output stage of the tuner.

The invention further relates to the provision of a novel radio tuner having such a small power requirement that it can be powered from such an audio amplifier circuit having no excess or reserve power without adversely affecting such amplifier.

In substantially all instances when electronic equipment employing audio amplifiers and output speakers is used it is a desired advantage to be able to play radio programs over such audio amplifiers and speakers. In the more expensive or custom equipment the circuitry includes a radio circuit which is connected to or may be connected through suitable switches to the audio amplifier circuit. Thus such combinations as radio-phonographs or radio-record players, radio-television sets, radio-record-television units are well known particularly in the field of high fidelity or "hi-fi" equipment. Again, many public address or P.A. systems are on the market including circuits for reproducing both record and radio over the systems.

In the less expensive equipment such as the cheaper record players such as those employing simple A.C.-D.C. amplifiers while it has long been a very desirable objective it has never been deemed feasible to provide a combination of a radio with such equipment. In the first instance the power supply available in such equipment is not capable of operating any conventional radio tuner. In particular, there is no power available to heat the filaments of the tubes of present type radio tuners without upsetting the filament supply of the amplifier unit.

Further, it is not practical to connect a radio circuit into the audio amplifiers without adversely affecting their operation. While radio circuits with independent power supplies might be employed with such equipment if same were custom modified to include proper switching and the like, the cost involved in supplying the radio circuit, its attendant power supply, and the custom circuit and switch rearrangements necessary, would so price the equipment out of the market, that it could not be sold, since the capabilities of such audio amplifiers and the usual speakers employed therewith would not be adequate for expensive radio-record player combinations.

While the lack of feasibility of incorporating radio circuits into simple record players has been referred to by way of example it will be understood that the same problem exists throughout the whole range of electronic equipment utilizing simple audio-amplifiers and not specifically or custom designed to form the audio output stage of a radio.

It is the principal object of the present invention to enable even the simplest audio amplifier having no excess or reserve power to form the audio output stage of a radio without requiring any redesign of the amplifier or adding any significant cost to its manufacture.

It is a further important object to enable such an amplifier to be converted into the output stage of a radio at a very low cost by the purchase of a simple plug-in unit. Thus it is the object to enable the continued manufacture without any circuitry redesign and without any significant cost increase of any and all present electronic equipment employing audio amplifiers, yet enabling such equipment to be converted into a radio by the purchase of a simple inexpensive readily connectable or plug-in unit which will effect such conversion without in any way adversely affecting the normal function of the equipment.

A further important object is to enable the conversion of such present equipment by the mere addition to the equipment of the requisite fitting or socket for receiving such connectable or plug-in unit and simple fitting or socket connections whereby the equipment is rendered convertible at negligible expense in manufacture.

With the above objects of the invention in mind, it will be understood that it is a further important object to manufacture a whole range of equipment which can be sold as a combination of a radio and such equipment with the plug-in or connectable unit installed or can be sold minus such unit but ready for conversion into a radio combination by the mere addition of such unit. Thus it is now possible, according to the invention, to manufacture a line of electronic equipment of the type referred to with much greater standardization and with much greater versatility of performance and hence greater saleability than previously possible, greatly reducing inventories and costs.

Another important object is to provide through the plug-in unit a novel and effective switching arrangement for switching between radio reproduction and the original intended function of the equipment without requiring the cost of adding any switch into the equipment. In this connection it is to be noted that it is an object to enable the owner of the original equipment both to add to the equipment the necessary plug-in unit and to effect the proper switching through operation of said plug-in unit without requiring any tools or without requiring any special knowledge.

The principal feature of the invention resides in the provision of a parasite radio tuner whose drain requirements will be such a small percentage of the operating currents or potentials or power in an audio amplifier that the addition or subtraction of this drain by the coupling or uncoupling of the tuner with the amplifier will be within the tolerable deviations which are to be expected and inherently must be acceptable in any amplifier circuit.

A further important feature resides in the provision of extremely simple readily releasible connections for connecting the parasite radio tuner and host audio amplifier so that the tuner can be powered from the amplifier even where such amplifier has in no way been designed to provide any power reserve, and the amplifier can form the audio output stage for the tuner.

According to the preferred form of the invention, the low drain parasite tuner is designed to operate at a relatively low voltage of the order of the bias or cathode voltage of the audio output stage of a simple conventional audio amplifier whereby, for example, the current drain through the cathode resistor providing the grid to cathode bias can be used to provide the additional function of supplying the power for the tuner without in any way adversely affecting its operation of providing the appropriate grid bias. Thus the invention enables the making use of what might in effect be considered waste power necessarily inherent in conventional audio amplifier designs.

Another important feature resides in forming the tuner as a very simple inexpensive unit. In this connection, according to the preferred form of the invention, the tuner comprises a transistorized radio tuner circuit having a low drain and requiring an operating voltage within the range of voltages readily available in the amplifier circuit, for instance, across the grid bias resistor of the amplifier.

A further important feature resides in providing from the tuner an audio output signal of sufficient strength to operate directly into the simplest low gain audio amplifier.

Another important feature resides in bringing the selected voltage pick off point and an input lead out from the audio amplifier to a convenient point of connection, preferably a socket receptacle, at the time of manufacture of the original equipment, for ready connection to the radio tuner. In this connection, it will be understood that the bringing out of such connections will in no way involve circuit redesign of the audio amplifier and the cost involved will be relatively small comprising only the cost of the socket receptacle or other fitting and the connections thereto.

For purposes of standardization, it is also another feature to incorporate into the socket connections for leading the tuner signal into the socket at an intermediate stage whereby the final output level of the tuner signal delivered to the audio amplifier may be controlled. That is, by jumpering such latter connections maximum signal output from the tuner can be obtained for driving a low cost, low gain amplifier where some distortion can be tolerated. Alternatively, such connections may be bridged by the desired impedance for selecting the ultimate tuner output signal level and character in the case the tuner is connected to a high gain amplifier or an amplifier having any other particular characteristic where distortion must be minimized or eliminated. In this way, the radio tuner may be designed as a standardized unit without the expense of a volume control and the particular equipment which is to be combined with the radio tuner can incorporate in association with the socket connections the requisite impedance valves to produce in the ultimate tuner signal presented to the particular audio amplifier circuit the requisite audio signal levels or characteristics.

As in many instances, it may be desired to employ the radio tuner with electronic equipment having two amplifier channels such as stereophonic record players, it is another feature to provide the tuner with two audio output connections, one D.C. isolated from the other, and to incorporate into the socket connections for delivering such radio tuner outputs into the two audio channels of the equipment.

Still another important feature resides in the novel physical form of the radio tuner for plug-in connection with the socket.

Again, it is an important feature to incorporate in the tuner socket and tuner a novel switch arrangement whereby connection to and from the audio amplifier is made through in and out movement of the tuner in the socket dispensing with the necessity of any separate switch component which would add to the expense of the equipment.

Still a further feature resides in providing a simple and effective indexing means for establishing the on-off positions of the radio tuner.

These and other objects and features will become apparent from the following detailed description taken in conjunction with the accompanying drawings in which.

Figures 4, 5:
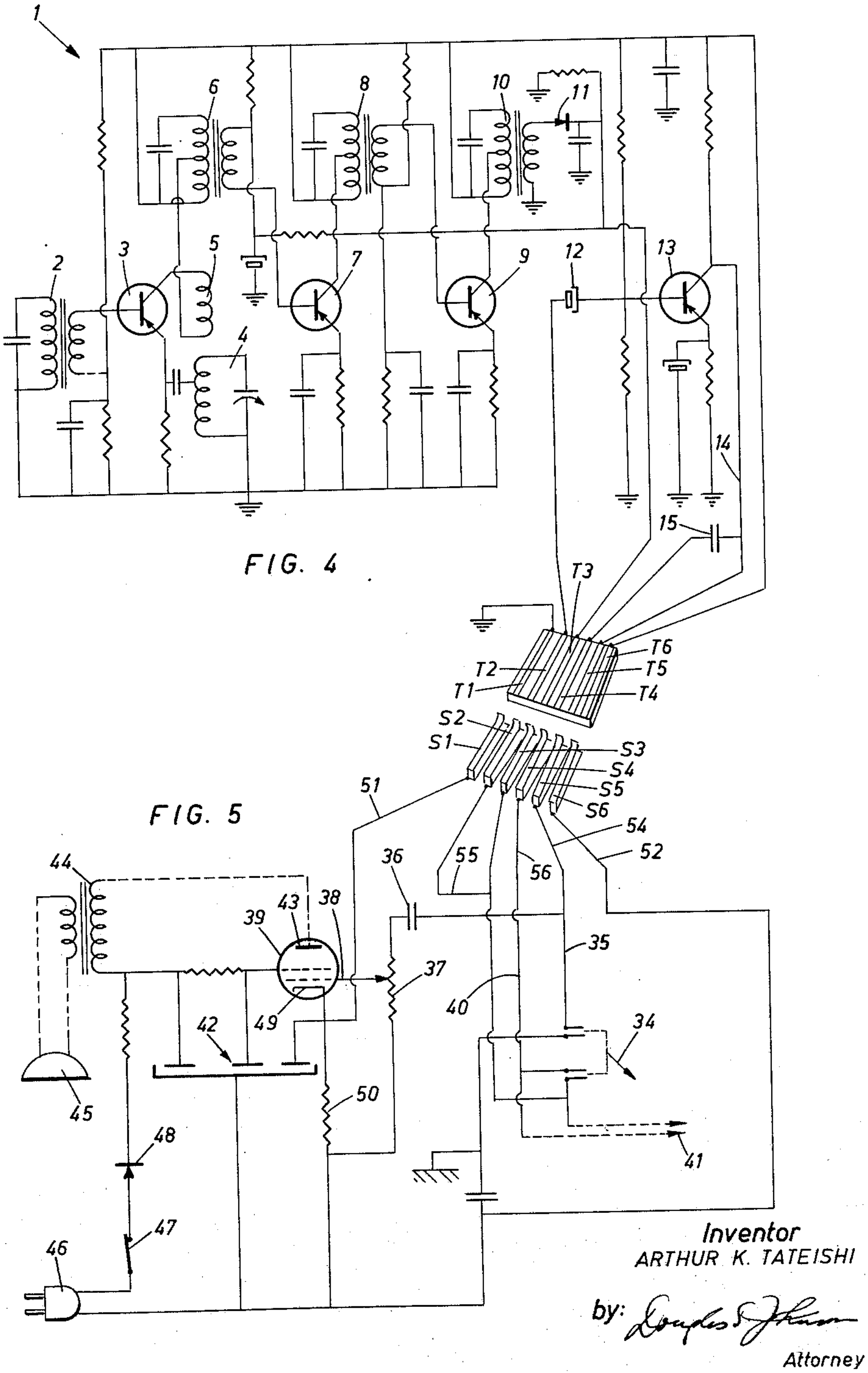
FIGURE 4 is a partly schematic, partly diagrammatic view comprising the wiring diagram of the radio tuner and showing in diagrammatic form the manner in which the contacts are brought out from the tuner for connection into the socket.
FIGURE 5 is a partly schematic, partly diagrammatic view illustrating a typical simple A.C.-D.C. low gain audio amplifier circuit such as used in an inexpensive record player and showing the manner in which the connections are brought out to the socket contacts for plug-in connection with the radio tuner.

Referring first to FIGURE 4, according to the invention there is provided a radio tuner generally designated at 1 which in the particular circuit shown, according to the preferred form of the invention, employs as the detecting and amplifying elements, transistors which can operate at low drain on a power supply voltage of the order of the voltages available as the grid bias voltage or in the cathode circuit of an ordinary conventional tube audio amplifier. Thus, in the radio tuner shown in FIGURE 4 and embodying the invention, there is provided a loopstick 2 delivering the radio frequency signal picked up into a transistor 3 which comprises a mixer and oscillator when used in conjunction with the tuned circuit 4 and feed-back circuit 5. The intermediate frequency signal delivered out from the transistor 3 is coupled through coupling circuit 6 to a transistor 7 which forms an intermediate frequency or I.F. stage amplifier. The output of the transistor 7 is then fed through coupling circuit 8 to a further I.F. amplifier comprised by a transistor 9. The I.F. output of the transistor 9 is then fed through coupling circuit 10 to a detector 11 which may comprise a suitable uni-directional device such as those known as diodes and the audio frequency signal delivered from the detector 11 is fed to a contact $T_3$. A further tuner contact $T_2$ is then connected through coupling condenser 12 to an audio amplifying stage comprised by a transistor 13. The output from the audio amplifier 13 is then delivered through lead 14 to two contacts—contact $T_4$ and contact $T_5$—the two contacts being D.C. isolated by a condenser 15. Two additional contacts are provided on the tuner—contact $T_1$ which is grounded to the frame and contact $T_6$ through which the supply voltage is adapted to be fed to the transistor circuits.

The purpose of contacts $T_2$ and $T_3$ and the dual output contacts $T_4$ and $T_5$ will hereinafter appear, but it will be appreciated that when the requisite supply voltage is applied between contacts $T_1$ and $T_6$ the radio tuner will operate to pick up the R.F. signal, convert it into an intermediate frequency signal, amplify it through to the detector circuit whereupon the detected signal will be delivered upon contacts $T_2$ and $T_3$ being connected to the audio amplifier 13 to provide an audio output signal at contacts $T_4$ and $T_5$. The important concept in connection with the tuner, in accordance with the invention, is the selection of a circuit or circuits capable of producing an audio output or outputs at the contacts $T_4$ and $T_5$ while requiring such a low drain that such circuit or circuits can be powered from a conventional audio amplifier circuit which does not include in its design any excess or reserve power.

Thus a tuner circuit such as the transistorized circuit of FIGURE 4 is one adaptation of the invention since it requires such a low drain constituting only a small percentage of the operating currents necessarily flowing in a conventional audio amplifier circuit that the coupling of the circuit as a parasite to the amplifier will not alter the current voltage or power values of the amplifier outside of the accepted tolerations of such an amplifier circuit.

However, while the particular circuit illustrated in FIGURE 4 is a single channel amplitude modulated receiver, it will be understood that the invention is equally applicable to frequency modulated receivers and to combinations of A.M. or F.M. receivers or multiple receivers of either A.M. or F.M. for reception of stereophonic or dual signal broadcasts.

In connection with such multiple channel receivers, one audio output would be fed to $T_4$ and the other to $T_5$.

While transistors have been illustrated in the circuit of FIGURE 4, it will be understood that other low drain devices capable of performing the function of these transistors may be used. For instance, there has now been developed a new type of tube requiring no filament supply which could be used to carry out the invention.

Again, while transistors comprise the preferred circuit elements in the provision of a low drain radio tuner, the invention in its widest aspect is directed to the provision of a tuner in any form which will have such a small power requirement that it can be connected into an amplifier circuit having in itself no reserve of power without adversely affecting such circuit. Thus, it is also within the scope of the invention to utilize conventional battery type tubes to provide the equivalent electronic functions of the transistors in the tuner circuit by connecting the filaments of the tubes in series and causing the cathode current of the amplifier tube to pass therethrough. In such a tuner circuit the H.T. for such tubes can be obtained from the H.T. of the amplifier without affecting the amplifier gain because of the low current drains taken by such tubes.

Figures 1, 2, 3:
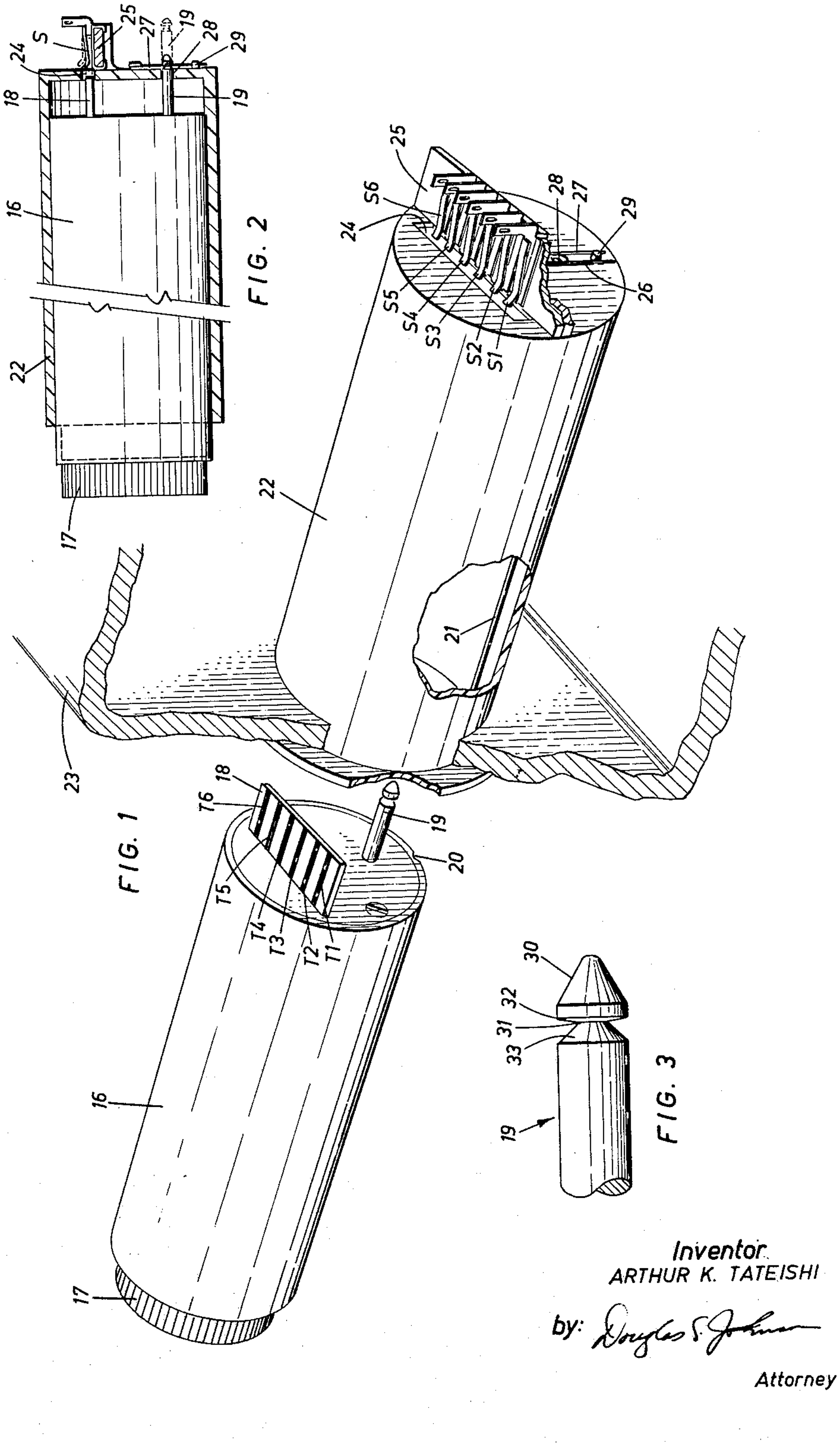
FIGURE 1 is a perspective view partially broken away showing a radio tuner constructed to embody the invention about to be plugged into a socket provided in an audio amplifier.
FIGURE 2 is a side elevational view partly broken away showing the tuner in solid line position about to be moved from an indexed withdrawn position into the final plug-in position showing in dotted lines the position of the tuner in the final plug-in position.
FIGURE 3 is a fragmentary enlarged elevational detail of the end of a post member carried by the tuner.

FIGURE 1 illustrates the physical form which the radio tuner of FIGURE 4 may take. In this case, the components described above are housed in a cylindrical casing 16 and a tuning dial 17 is provided at the forward end of the casing to select the desired signal frequency as in the case of ordinary radio tuning. The contacts $T_1$ to $T_6$ are brought out at the rear of the casing 16 as conductor strips mounted on an insulating rigid platform 18. An indexing post 19 projects rearwardly from the rear of the casing 16 and the casing is provided with a groove 20 forming a keyway to receive a key 21 formed in a mating socket 22 adapted to receive the tuner.

The socket 22 is shown as mounted in the casing 23 of a piece of equipment which can be considered to represent a simple audio amplifier in a record player or any more complicated equipment employing an audio amplifier.

The socket 22 is provided with a slot 24 at its rear through which the platform 18 carried by the tuner and supporting the contacts $T_1$ to $T_6$ may slide. Registering behind the slot 24 is a series of socket contact fingers $S_1$, $S_2$, $S_3$, $S_4$, $S_5$, $S_6$, and these contacts correspond to the contacts $T_1$ to $T_6$ and are in the form of resilient cantilever fingers spaced above a rigid platform 25 over which the tuner platform 18 is adapted to slide.

The arrangement is such that with the tuner casing 16 pushed fully home into the socket 22, the contacts $T_1$ to $T_6$ carried by the platform 18 will be forced beneath and will be in registering contact with the corresponding overlying socket contacts $S_1$ to $S_6$.

As illustrated in FIGURE 2, the tuner casing 16 has a partially withdrawn indexed position, as shown in solid lines, such that the tuner contacts $T_1$ to $T_6$ are withdrawn clear of the socket contacts $S_1$ to $S_6$. This is the normal position of the tuner when the audio amplifier is being used in its normal function and the tuner is inoperative. This indexing is achieved through the use of a spring carried at the rear of the socket 22 and having a pair of spring arms 26 and 27 straddling an opening 28 in the rear of the socket. A projecting pin 29 limits the inward movement of the spring arms 26 and 27 which act resiliently inwardly.

The indexing post 19 is adapted to register with and move through the opening 28 in the end of the socket as the tuner casing 16 is pushed into the socket. As seen particularly in FIGURE 3, the head of the post 19 is tapered as at 30 to spread the spring arms 26 and 27 apart allowing ready insertion of the tuner. Behind the head, the post 19 is undercut as at 31 to present a surface 32 adjacent to the head which has a steep angle of rise out to the head and a surface 33 remote from the head which has a much shallower angle of rise. When the tuner casing 16 is moved to the position to bring the spring arms 26 and 27 resiliently into the undercut 31, the tuner is located so that the tuner contacts $T_1$ to $T_6$ are clear of the socket contacts $S_1$ to $S_6$. However, because of the relatively shallow angle of the surface 33, the tuner can be readily pushed further inwardly to the dotted line position of FIGURE 2 to bring the contacts $T_1$ to $T_6$ beneath the contacts $S_1$ to $S_6$ to be resiliently engaged thereby. However, when the tuner is withdrawn to interrupt the connection between the contacts $T_1$ to $T_6$ and $S_1$ to $S_6$, outward movement will be arrested upon the spring arms 26 and 27 dropping into the undercut 31, and because of the steepness of the surface 32 a much more substantial pull will be necessary to completely withdraw the tuner to cause the arms to ride up the surface 32 than the pull necessary to interrupt connections between the tuner and socket contacts.

FIGURE 5 illustrates the connections which may be made to the socket contacts $S_1$ to $S_6$ in the case of a simple low gain A.C.-D.C. audio amplifier.

In this case, the audio amplifier is shown as part of a record player circuit which may include a stereophonic or two-channel pick-up cartridge 34, one channel of which is adapted to be fed through the lead 35 and input condenser 36 through a volume control 37 connected to the control grid 38 of an audio amplifier tube 39. The other output channel of the pick-up cartridge 34 may feed through a lead 40 to an output connection 41 which can be coupled into an amplifier similar to the amplifier 39 so that the two pick-up signals from the cartridge may be played simultaneously over corresponding amplifier circuits for stereophonic reproduction.

The illustration of the circuit as including a stereophonic pick-up cartridge is purely to illustrate the fact that the nature of the circuit in its normal function as an audio amplifier is immaterial to the present invention and the pick-up cartridge, for instance, might be a simple monaural cartridge, and the second pick-up and the output to the second amplifier as illustrated at 40 may be dispensed with.

In this case, the audio amplifier tube 39 is powered directly from the line through the use of a suitable filter circuit 42 and the output from the plate 43 of the tube 39 is delivered through audio transformer 44 to a speaker 45. A plug 46 provides for plug-in of the circuit to the line; an on-off switch is provided at 47, and a uni-directional device, for instance, a selenium rectifier may be employed as illustrated at 48.

Provided in the circuit of the cathode 49 of the tube 39 is a grid bias resistor 50 by means of which a negative bias is applied to the control grid 38 of the tube as will be understood in the art, and normally with conventional tube requirements this grid bias voltage developed between the cathode and control grid is a voltage falling within the desired operating range of the requirement of the supply voltage of the radio tuner 1. That is, the grid bias voltage requirement for the audio amplifier tube 39 is normally substantially of the order of six to nine volts and the supply voltage required for the tuner 1 may conveniently coincide with the grid bias voltage requirements. Thus, by bringing a lead 51 out to socket contact $S_1$ at cathode potential, and bringing a lead 52 out from the bottom end of the grid bias resistor 50 to the socket $S_6$, there is provided across the sockets $S_1$, $S_6$, the requisite supply voltage for a radio tuner. Thus, when the radio tuner is plugged into the socket, there is provided across the tuner contacts $T_1$, $T_6$, the requisite supply voltage. This supply voltage is thus provided by means of two simple connections which in no way require a redesign of the amplifier circuit and with the radio tuner withdrawn in the socket to the solid line position of FIGURE 2 to interrupt the connection between the tuner and socket contacts, the amplifier can function to reproduce the signal delivered from the cartridge 34 without any adverse effect.

It is to be understood that not only does the tuner of FIGURE 4 operate on a voltage corresponding to the voltage available across the grid bias resistor 50, the drain requirements of the tuner, which are of the order of less than two milliamperes will be so low that the connecting of the tuner across the resistor 50 will not drop the grid bias voltage below the inherently acceptable or tolerable limit of grid bias variation or drop and similarly when the tuner is unplugged or disconnected the voltage rise across the resistor 50 will be within the inherently acceptable grid bias rise or variation tolerated by the amplifier.

Figure 9:
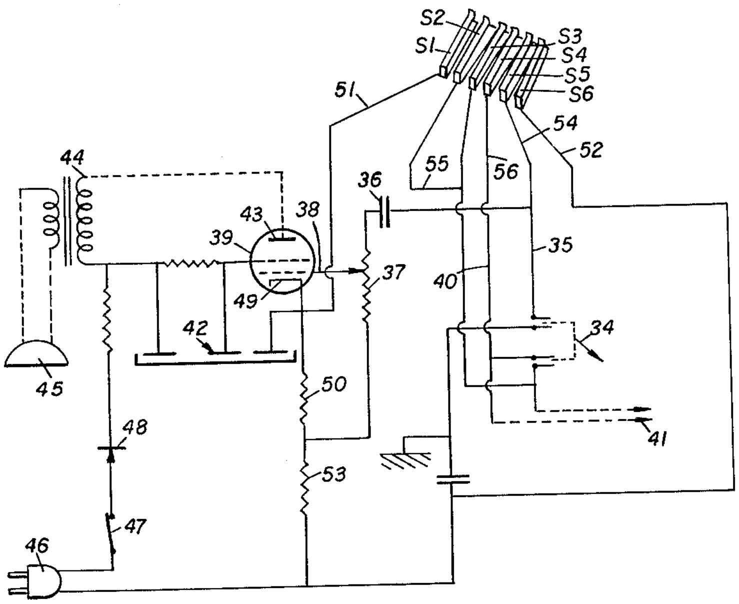
FIGURE 9 is an alternative embodiment of the circuit illustrated in FIGURE 5.

In the event that the amplifier tube 39 should operate at a grid bias somewhat less than the required supply voltage for the tuner, a further resistor 53, as shown in FIGURE 9, may be incorporated into the amplifier circuit. This further resistor 53 will increase the voltage drop provided across the resistors 50 and 53, that is, increase the voltage drop across the contacts $S_1$, $S_6$, and hence $T_1$, $T_6$, to provide the requisite supply voltage without in any way altering the grid bias voltage applied to the amplifier tube. Thus, even in unusual cases, no redesign of the audio amplifier circuitry is required and there need only be added to the circuit a simple voltage dropping resistor, such as resistor 53.

Connected on the input side of the input condenser 36 to the socket contact $S_5$ is a lead 54. Thus when the output from the radio tuner is delivered through contact $T_5$ to socket $S_5$ this output is delivered into the input circuit of the audio amplifier of FIGURE 5, so that the audio amplifier can amplify and reproduce through the speaker 45 the audio signal delivered from the tuner.

A connection 55 is arranged to short the socket connections $S_2$ and $S_3$ so that the signal delivered to the tuner contact $T_3$ is delivered across the socket contacts $S_2$ and $S_3$ and back to the tuner contact $T_2$ for delivery without modification to the final output stage of the tuner comprised by the transistor 13. The reason for this arrangement is that the maximum gain or output provided by the radio tuner is selected as being sufficient to operate the simple type of amplifier illustrated in FIGURE 5, and for proper operation of such a simple amplifier circuit, no attenuation of the output signal from the tuner is desired.

The socket connection $S_4$ is connected through lead 56 to the output 41 so that in the event the circuit of FIGURE 5 is associated with the second similar amplifier, both amplifiers may be utilized to reproduce the audio signal from the tuner so that additional audio output power will be available. In this case, it will be appreciated that the isolating condenser 15 will prevent a D.C. short between the two audio amplifiers should such amplifiers be plugged into the mains in a reverse direction.

It will also be understood that the relatively low resistance which is placed across the cartridge 34 when the radio tuner is plugged into the socket will be such as to effectively short-circuit the cartridge and prevent interference from the cartridge even if the record player tone arm should be playing on the record when the radio is in the plug-in position.

It will be understood that in operation, when it is desired to play the radio, the tuner casing 16 is simply pushed from the indexed "off" position shown in solid line in FIGURE 2 inwardly to the dotted line position of FIGURE 2 whereupon power is then supplied to the tuner and the output from the tuner is delivered to the amplifier for amplification thereby and reproduction through the speaker 45.

On the other hand, when it is desired to use the amplifier of FIGURE 5 for its normal function, the radio tuner casing 16 is simply pulled outwardly against the relatively light resistance until it reaches the solid line indexed position of FIGURE 2 whereupon the connections between the tuner and audio amplifier are interrupted and the audio amplifier can function without any adverse effect either from the tuner or the connections taken out to the socket 22.

It will be appreciated that the only additions required to the audio amplifier to render it capable of forming the output circuit of a radio tuner, according to the invention, are the provision of the socket 22 and the connections to the contacts thereof and, under some circumstances, the addition of a voltage dropping resistor such as resistor 53. Thus, at relatively little cost, a simple piece of equipment employing the simplest of audio amplifiers may be rendered capable of being converted into a radio at substantially negligible cost.

Thus, in accordance with the invention, it is possible to manufacture a whole line of electronic equipment employing audio amplifiers while rendering such line capable of being converted into a radio without appreciable increase in manufacturing costs. When the purchaser desires to convert his set, he is simply required to purchase the radio tuner of FIGURE 1 which, due to the absence of any internal power supply and due to the absence of any final audio output stage or speaker, can be made as a very inexpensive unit.

It will be understood that normally the socket 22 can be covered with a suitable plug (not shown) and when the user desires to convert, he simply removes the plug and inserts the tuner 1.

By virtue of the fact that the movement of the tuner itself as indexed provides an on-off switch, no switch component is required in either the original audio amplifier equipment or the tuner to effect conversion and operation of the equipment.

Figures 6, 7, 8:
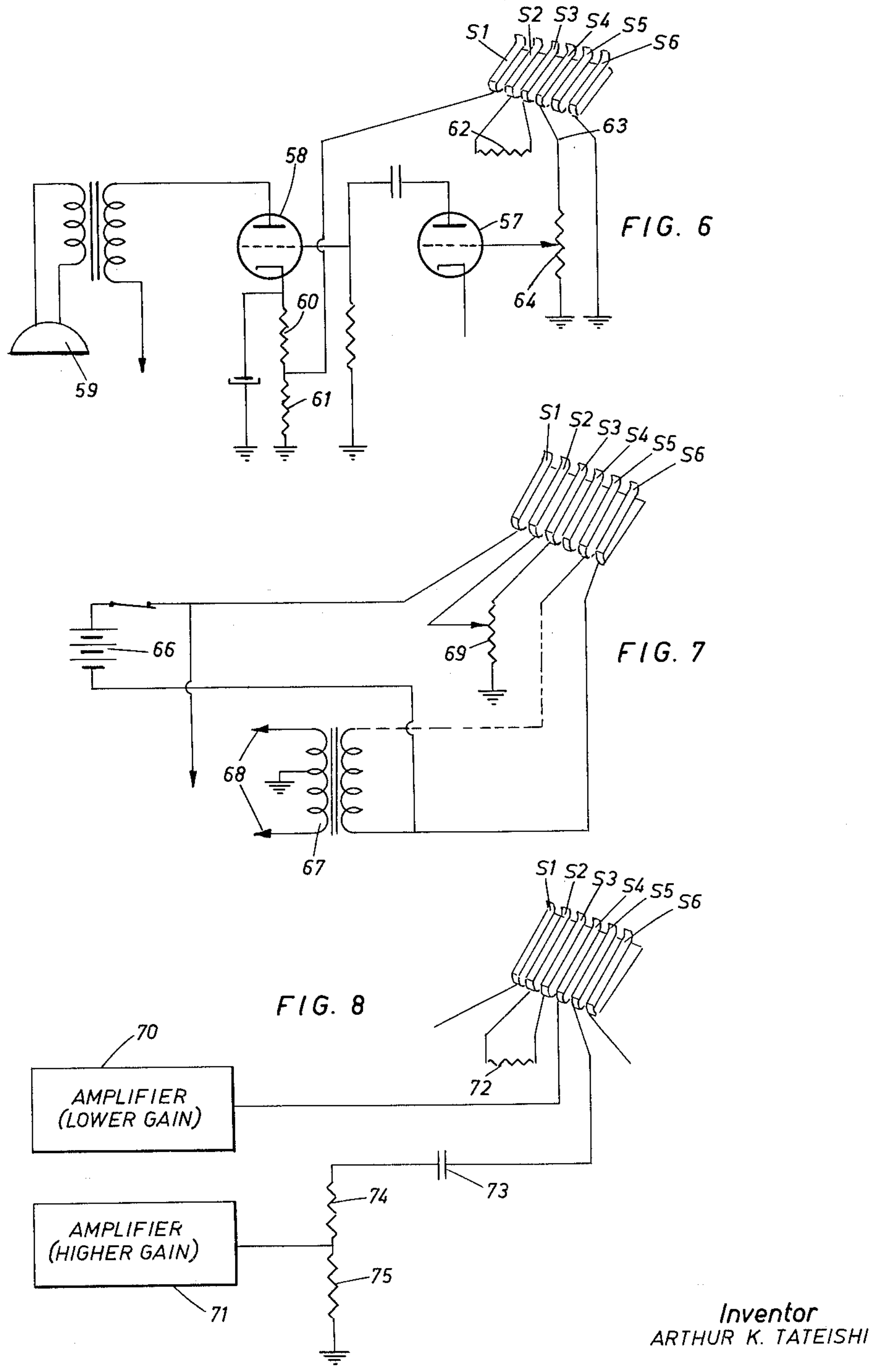
FIGURE 6 is a view similar to FIGURE 5 but illustrating a more complex audio amplifier comprising a high gain single channel amplifier.
FIGURE 7 is again a view similar to FIGURES 5 and 6 but illustrating again a different form of audio amplifier circuit employing a battery as the power source and arranged to feed a class "B" push-pull stage output.
FIGURE 8 is again a similar figure to FIGURES 5, 6 and 7, but illustrating a dual channel, high gain amplifier.

FIGURE 6 illustrates the application of the invention to a different form of audio amplifier. In this case the audio amplifier comprises a first amplifier stage 57, comprised by a triode, and an output stage 58 which feeds a speaker 59.

In this case, the cathode to grid bias may be of a greater value than that desired to supply the radio tuner and resistors 60 and 61 are provided in the cathode circuit of the output stage or tube 58 such that the resistor 61 provides the voltage drop required for the tuner and the resistor 60 provides the additional drop to bring the voltage across resistors 60 and 61 in series up to the correct operating voltage for the tube 58. The separating of the resistance value in the cathode circuit of the tube 58 in no way requires redesign or alteration of the design of the amplifier circuit but merely physically provides a means of picking off from the cathode circuit the requisite voltage to be fed to the socket contacts $S_1$ and $S_6$ for operating the tuner when it is plugged into the socket.

In the case of the amplifier circuit of FIGURE 6, because of the high gain achieved in the amplifier circuit, a lower signal level can be fed into the input of the audio amplifier. Thus there is connected across socket contacts $S_3$ and $S_2$, a resistor 62 to reduce the level of the signal fed into the input of the output stage 13 of the radio tuner with the attendant reduction in the level of the output signal delivered from the audio amplifier 13 of the radio tuner through the tuner contact $T_4$ and the socket contact $S_4$ which is connected through lead 63 and volume control 64 to the input of the first amplifier stage 57 of the amplifier.

Figure 10:
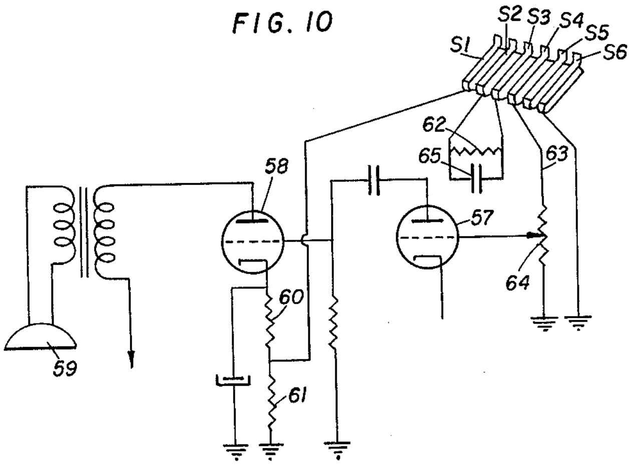
FIGURE 10 is an alternative embodiment of the circuit illustrated in FIGURE 6.

If desired, a high frequency boost may be achieved through the inclusion of a condenser 65 across the socket contacts $S_3$ and $S_2$ as shown in FIGURE 10.

As will be understood in the art, transistor circuits depend mainly on current amplification rather than voltage amplification. Appreciable distortion is generated in transistor circuits operating at large voltage swings. To minimize or eliminate distortion, therefore, large voltage swings are to be avoided. Thus in the case of a high gain amplifier such as illustrated in FIGURE 6 which can be operated at low input signal voltages, the resistor 62 provides a means of reducing the voltage fluctuations in the transistor tuner circuit providing in conjunction with the reduced voltage output through to the socket contact $S_4$ a substantially distortion-free audio signal. However, in order that the tuner can be a standard component for use with the full range of audio amplifier circuits, the tuner circuit is designed so that in the absence of the provision of a resistor such as resistor 62, adequate voltage output will be developed from the tuner to feed the audio amplifier. In the case of low gain amplifiers, that is, inexpensive amplifiers, some distortion can be tolerated as the amplifier circuit itself will inherently have poorer reproduction characteristics than the more complex and expensive higher quality audio amplifiers.

Since the audio amplifier of FIGURE 6 is a single channel amplifier, there is no connection to the socket contact $S_5$ and only one of the outputs from the tuner fed through socket contact $S_4$ is utilized.

The amplifier illustrated in FIGURE 7 comprises a battery powered circuit for driving, for instance, a class "B" push-pull transistor output stage (not shown). Power for the tuner in this case is therefore obtained from battery 66 and the battery is connected across socket contacts $S_1$ and $S_6$.

In this case, there is provided a transformer coupling 67 for coupling the output of the radio tuner 1 to the output stage which is connectable between the arrows 68.

As the amplifier will constitute a relatively high gain amplifier, there is shown connected between socket contacts $S_3$ and $S_2$ a variable volume control resistor 69. In this case, rather than a pre-selected fixed resistor, the variable resistor is utilized to control the output level of the output stage of the radio transistor tuner.

Again, since the amplifier is a single channel amplifier there is a single connection from the output of the tuner through socket contact $S_5$ feeding the transformer 67.

In FIGURE 8, the radio tuner is adapted to be connected to a circuit shown as a two-channel circuit comprising a channel A amplifier 70 with lower gain and a channel B amplifier 71 of higher gain. In this case again, voltage will be picked off and applied to the socket connections $S_1$ and $S_6$ in accordance with the invention as previously described. Connected between socket contacts $S_3$ and $S_2$ is a resistor 72 which will be selected for optimum output for the lower gain channel A. Channel A amplifier is fed from the radio tuner through the appropriate tuner contact $T_4$ connected with the socket contact $S_4$ and the circuit will include the condenser 15. The other output of the radio tuner through tuner contact $T_5$ will be delivered through socket contact $S_5$ into isolating capacitor 73 and a signal voltage will be picked off between resistors 74 and 75 and fed to the channel B amplifier.

In this case, where channel A has a different gain than channel B, the resistors 74 and 75 will be chosen as follows:

$$\frac{R75}{R74+R75}=\frac{\text{gain channel B}}{\text{gain channel A}}$$

It will be understood that the various circuits illustrated are given solely for the purpose of examples showing the application of the invention and it will be understood that the invention is not limited to the particular circuits herein illustrated but will have wide application as noted in the objects and features of the invention. Various alterations and arrangements both in the specific circuitry involved and the mechanical arrangements may be made without departing from the spirit of the invention or scope of the appended claims.

The embodiments of the invention in which an exclusive property or privilege is claimed are defined as follows:

1. In combination an audio amplifier, a radio tuner characterized in that its drain requirements are sufficiently low that it can be parasitically connected to the amplifier to be completely powered thereby without significant alteration of the operating conditions of the amplifier while the amplifier forms a host therefor, and when so powered providing from an audio frequency modulated radio frequency input an audio frequency signal for such host audio amplifier, and means for releasably interconnecting said audio amplifier and tuner to pick off from said audio amplifier a tuner power supply voltage for powering the tuner and to deliver an audio frequency signal from said tuner to said audio amplifier.

2. In combination an audio amplifier, and a radio tuner, said audio amplifier and radio tuner having means for mutual connection and disconnection, said radio tuner being adapted to be completely powered from the audio amplifier and when so powered to deliver from an audio frequency modulated radio frequency input an audio frequency signal thereto, said tuner having a low drain requirement such that its connection to and disconnection from said audio amplifier will provide a variation in the operating conditions of said audio amplifier within the variation tolerances acceptable in said audio amplifier.

3. In combination a host audio amplifier and a parasite radio tuner requiring external powering and adapted to provide an audio frequency output from an audio frequency modulated radio frequency input, said tuner having a low drain requirement such that its connection to and disconnection from said audio amplifier to draw and cut off power respectively to the tuner for complete powering of the tuner will provide less variation in the operating conditions of said audio amplifier than the tolerable variations for such audio amplifier and interruptible connection means for parasitically connecting said tuner to and for disconnecting said tuner from said amplifier.

4. The combination as claimed in claim 3 in which said means providing interruptible connections between said amplifier and tuner comprise a socket permanently connected to said amplifier and having a set of contact fingers, and said radio tuner is adapted to plug into said socket and carries a set of contacts engageable with said contact fingers with said tuner plugged into said socket.

5. The combination as claimed in claim 4 in which said contact fingers comprise a plurality of resilient cantilever fingers spaced above a rigid platform carrier at the rear of said socket and said radio tuner contacts comprise a plurality of contact strips mounted on a rigid platform adapted to slidingly engage said first mentioned rigid platform upon plugging said tuner fully into said socket with said contact strips engaging beneath and in contact with said resilient contact fingers.

6. In combination a host audio amplifier and a parasite radio tuner requiring external powering, said tuner having a low drain requirement such that its connection to and disconnection from said audio amplifier to draw and cut off power to the tuner will provide less variation in the operating conditions of said audio amplifier than the tolerable variations for such audio amplifier, interruptible connection means for parasitically connecting said tuner to and for disconnecting said tuner from said amplifier comprising a socket permanently connected to said amplifier and having a set of contact fingers, said radio tuner being adapted to plug into said socket and carrying a set of contacts engageable with said contact fingers with said tuner plugged into said socket, and indexing means to locate said radio tuner in a position partially withdrawn from said socket with said tuner contacts out of contact with said socket contact fingers, said indexing means being adapted to release said tuner for movement fully home into said socket to bring said tuner contacts into engagement with said socket contact fingers, whereby movement of said tuner between said partially withdrawn and said fully home positions provides a tuner off-on switching action.

7. The combination as claimed in claim 6 in which said indexing means resists movement of said tuner out of said socket under normal withdrawal pressure sufficient to withdraw said tuner from said fully home position to said partially withdrawn position.

8. The combination as claimed in claim 7 in which said indexing means comprises a post member carried by said tuner and spaced spring members carried by said socket to resiliently engage said post member on opposite sides thereof, said post member having a tapered head adapted to spread said spring member to introduce said post therebetween upon movement of said tuner into said socket, and said post having an undercut behind said tapered head to receive said spring members with said tuner moved to said partially withdrawn position to index said tuner at said position.

9. The combination as claimed in claim 8 in which said undercut behind said head in formed to provide a steep angle running out from said undercut to the surface of said post at the side thereof adjacent to said head and a relatively lesser angle running out from said undercut to the surface of said post remote from said head whereby said tuner may be moved between said fully home and said partially withdrawn positions under a relatively light force, and a relatively larger force is required to fully withdraw said tuner from socket.

10. A combination as claimed in claim 4 in which said set of contact fingers includes two contact fingers adapted to be bridged by a selected impedance to set the output voltage level of said radio tuner and said tuner contacts include a pair of contacts corresponding to said latter two contact fingers connected to lead signals generated in said radio tuner into said socket through any selected impedance bridging said two last mentioned socket contact fingers and to return such signals to a final audio amplifier stage in said tuner prior to final signal delivery from said tuner to said audio amplifier.

11. A combination as claimed in claim 3 in which said interruptible connections between said amplifier and tuner include two output connections for delivering audio frequency outputs from said tuner through two different output channels, and means providing a D.C. block between said two output connections.

12. In combination an audio amplifier provided with an amplifying tube, having a negatively biased control grid, a transistor radio tuner adapted to be externally powered at a voltage of the order of the bias voltage of said amplifying tube and comprising circuit means for producing an audio frequency signal from an audio frequency modulated radio frequency signal, and connection means providing an interruptible connection between said amplifier and tuner to supply power to said tuner for the complete powering thereof from said amplifier and to deliver an audio frequency signal from said tuner to said amplifier.

13. A combination as claimed in claim 12 in which said connection means comprises a connection from the cathode of said amplifier tube to said tuner to power said tuner and a connection from said tuner to the control grid of said amplifier tube to deliver signals from said tuner to said amplifier.

14. A combination as claimed in claim 12 in which said connection means comprises mating plug-in connecting means provided respectively on said amplifier and tuner.

15. In combination an audio amplifier provided with an amplifying tube having a negatively biased control grid, a transistor radio tuner adapted to be externally powered at a voltage of the order of the bias voltage of said amplifying tube, connection means providing an interruptible connection between said amplifier and tuner to supply power to said tuner from said amplifier and to deliver an audio frequency signal from said tuner to said amplifier, said connecting means comprising mating plug-in connecting means provided respectively on said amplifier and tuner, and indexing means to index relative positions of said amplifier and tuner for interruption of connection therebetween, said indexing means being operable to release said tuner for complete removal from said amplifier.

16. In combination a socket adapted to be connected into an audio amplifier circuit and having a set of contacts connected therewith including a pair of contacts to be connected across a voltage available in the amplifier circuit and a contact to be connected to an input point of the amplifier, and a radio tuner for producing an audio frequency signal from an audio frequency modulated radio frequency signal characterized in that its drain requirements are sufficiently low that it can be parasitically connected to an amplifier to be completely powered thereby without significant alteration of the operating conditions of the amplifier, said radio tuner having connections brought out for releasable interconnection with said pair of socket contacts to pick off an operating voltage therefrom and having a further connection brought out therefrom for delivering an audio frequency signal to said socket contact adapted to be connected to an input point of an audio amplifier.

17. The combination as claimed in claim 16 in which said socket comprises a receptacle open at the front and having said contacts arranged at the inner end thereof, and said radio tuner is enclosed in a casing adapted to be slidably received in said socket and said tuner connections are located at the inner end of said casing, said socket contacts and tuner connections comprising mating male and female contacts adapted for plug-in connection.

18. In combination a socket adapted to be connected into an audio amplifier circuit and having a set of contacts connected therewith including a pair of contacts to be connected across a voltage available in the amplifier circuit and a contact to be connected to an input point of the amplifier, and a radio tuner characterized in that its drain requirements are sufficiently low that it can be parasitically connected to an amplifier to be powered thereby without significant alteration of the operating conditions of the amplifier, said radio tuner having connections brought out for releasable interconnection with said pair of socket contacts to pick off an operating voltage therefrom and having a further connection brought out therefrom for delivering an audio frequency signal to said socket contact adapted to be connected to an input point of an audio amplifier, said socket comprising a receptacle open at the front and having said contacts arranged at the inner end thereof, and said radio tuner being enclosed in a casing adapted to be slidably received in said socket and said tuner connections being located at the inner end of said casing, said socket contacts and tuner connections comprising mating male and female contacts adapted for plug-in connection, and indexing means to locate said radio tuner in a partially withdrawn index position in said socket with said male and female contacts withdrawn from plug-in connection, said indexing means being constructed and arranged to readily allow movement of said tuner to effect plug-in of said male and female contacts and to resist withdrawal of said tuner beyond said indexed position.

19. The combination as claimed in claim 18 in which said indexing means comprises a post member carried by said tuner and spaced spring members carried by said socket to resiliently engage said post member on opposite sides thereof, said post member having a tapered head adapted to spread said spring member to introduce said post therebetween upon movement of said tuner into said socket, and said post having an undercut behind said tapered head to receive said spring members with said tuner moved to said partially withdrawn position to index said tuner at said position.

20. The combination as claimed in claim 19 in which said undercut behind said head is formed to provide a steep angle running out from said undercut to the surface of said post at the side thereof adjacent to said head and a relatively lesser angle running out from said undercut to the surface of said post remote from said head whereby said tuner may be moved between said fully home and said partially withdrawn positions under a relatively light force, and a relatively larger force is required to fully withdraw said tuner from socket.

21. A radio tuner adapted to be powered by a voltage and at a drain whereby the tuner is adapted to be connected into even the simplest audio amplifier tube circuit having no power reserve to draw complete operating power therefrom and to deliver from an audio frequency modulated radio frequency signal a useable audio frequency signal to such audio amplifier without adversely affecting such audio amplifier circuit, said tuner having a contact arrangement for external connection, comprising contacts for connection to an external power supply source and contacts to deliver, upon said tuner being powered, an audio frequency signal for amplification.

22. A low drain radio tuner adapted for connection to an audio amplifier circuit employing a conventional tube amplifier and adapted to be completely powered from said circuit and to deliver from an audio frequency modulated radio frequency signal an audio frequency signal for amplification through such circuit without adversely affecting such circuit operation comprising a radio tuner utilizing transistors as its means of demodulation and amplification, whereby voltage requirements for said tuner are of the order of the bias voltage of a conventional amplifier tube, and the drain requirements for said tuner are sufficiently low that drain can be supplied from an audio amplifier without creating deviations of the operating conditions thereof beyond those normally tolerated, and means adapted for effecting connections between said audio tuner and an amplifier circuit to pick off from said amplifier circuit a voltage to power said tuner and to deliver an audio frequency signal to said amplifier circuit from said tuner.

23. A tuner as claimed in claim 22 in which the connections for delivering an audio frequency signal from said tuner comprise two D.C. isolated output connections.

24. A low drain radio tuner comprising a radio tuner for providing an audio frequency signal from an audio frequency modulated radio frequency signal utilizing transistors as the demodulating and amplifying elements adapted to be completely powered from voltages of the magnitude of those available in the cathode circuit of a conventional audio amplifier tube, said tuner being adapted to be supplied from an external source of power and having contacts brought out therefrom for picking off a supply voltage and for delivering an audio frequency output signal respectively.

References Cited in the file of this patent

UNITED STATES PATENTS

| | | |
|---|---|---|
| 1,654,296 | Loewe | Dec. 27, 1927 |
| 1,814,158 | Holden | July 14, 1931 |
| 2,032,193 | White | Feb. 25, 1936 |
| 2,882,511 | Mason | Apr. 14, 1959 |
| 2,892,931 | Koch | June 30, 1959 |
| 2,922,043 | Decker et al. | Jan. 19, 1960 |
| 2,951,154 | Birkenes | Aug. 30, 1960 |
| 2,989,623 | Byrne | June 20, 1961 |